US 9,324,776 B2

(12) United States Patent
Lee et al.

(10) Patent No.: US 9,324,776 B2
(45) Date of Patent: Apr. 26, 2016

(54) ORGANIC LIGHT-EMITTING DEVICE INCLUDING BARRIER LAYER INCLUDING SILICON OXIDE LAYER AND SILICON NITRIDE LAYER

(71) Applicant: SAMSUNG DISPLAY CO., LTD., Yongin-si, Gyeonggi-Do (KR)

(72) Inventors: Jae-Seob Lee, Yongin-si (KR); Dong-Un Jin, Yongin-si (KR)

(73) Assignee: Samsung Display Co., Ltd., Samsung-ro, Giheung-Gu, Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/860,245

(22) Filed: Sep. 21, 2015

(65) Prior Publication Data
US 2016/0020265 A1    Jan. 21, 2016

Related U.S. Application Data

(63) Continuation of application No. 13/754,405, filed on Jan. 30, 2013, now Pat. No. 9,142,804, which is a continuation-in-part of application No. 12/895,315, filed on Sep. 30, 2010, now abandoned.

(30) Foreign Application Priority Data

Feb. 9, 2010 (KR) .................. 10-2010-0012018

(51) Int. Cl.
*H01L 47/00* (2006.01)
*H01L 27/32* (2006.01)

(52) U.S. Cl.
CPC ........ *H01L 27/3274* (2013.01); *H01L 27/3258* (2013.01)

(58) Field of Classification Search
CPC ............ H01L 27/3274; H01L 27/3258; H01L 51/5296; H01L 51/56; H01L 51/5256; H01L 2251/5338; H01L 2251/55; H01L 2251/558
USPC ........................................................ 257/4, 40
See application file for complete search history.

(56) References Cited

U.S. PATENT DOCUMENTS 5,508,075 A * 4/1996 Roulin .................... B32B 27/08
                                                          428/216
5,532,063 A * 7/1996 Shindoh .................. C23C 14/10
                                                          106/286.1
(Continued)

FOREIGN PATENT DOCUMENTS

EP         1618821        1/2006
JP         04298722 A     10/1992
(Continued)

OTHER PUBLICATIONS

Korean Office Action issued by Korean Patent Office on Apr. 13, 2011 corresponding to Korean Patent Application No. 10-2010-0012018 was cited by Applicants in U.S. Appl. No. 12/895,315.
(Continued)

*Primary Examiner* — Caleb Henry
(74) *Attorney, Agent, or Firm* — Robert E. Bushnell, Esq.

(57) ABSTRACT

An organic light-emitting device including a barrier layer that includes a silicon oxide layer and a silicon-rich silicon nitride layer. The organic light-emitting device includes a flexible substrate that includes a barrier layer and plastic films disposed under and over the barrier layer. The barrier layer includes a silicon-rich silicon nitride layer and a silicon oxide layer. The order in which the silicon-rich silicon nitride layer and the silicon oxide layer are stacked is not limited and the silicon oxide layer may be first formed and then the silicon-rich silicon nitride layer may be stacked on the silicon oxide layer. The silicon-rich silicon nitride layer has a refractive index of 1.81 to 1.85.

8 Claims, 6 Drawing Sheets

(56) References Cited

U.S. PATENT DOCUMENTS

| | | | |
|---|---|---|---|
| 5,757,126 A | 5/1998 | Harvey, III et al. | |
| 6,727,588 B1* | 4/2004 | Abdelgadir | H01L 21/76829 257/751 |
| 7,034,453 B2* | 4/2006 | Kai | H01L 27/3246 313/503 |
| 7,086,918 B2 | 8/2006 | Hsiao et al. | |
| 7,790,487 B2 | 9/2010 | Shih et al. | |
| 7,816,668 B2* | 10/2010 | Kawakami | C07C 211/61 257/40 |
| 7,897,964 B2* | 3/2011 | Kawakami | C07C 211/61 257/40 |
| 8,030,169 B2* | 10/2011 | Kakehata | H01L 21/76254 257/E21.094 |
| 8,120,230 B2* | 2/2012 | Takai | H03H 9/02937 310/313 R |
| 8,212,280 B2* | 7/2012 | Ikeda | G09G 3/3291 257/103 |
| 8,610,155 B2* | 12/2013 | Hatano | H01L 27/3251 257/59 |
| 2005/0012248 A1* | 1/2005 | Yi | B32B 38/0036 264/482 |
| 2005/0041193 A1 | 2/2005 | Lifka et al. | |
| 2005/0146267 A1* | 7/2005 | Lee | B05D 1/60 313/506 |
| 2006/0286406 A1 | 12/2006 | Igarashi et al. | |
| 2006/0292774 A1* | 12/2006 | Chen | H01L 27/76834 438/197 |
| 2007/0012955 A1 | 1/2007 | Ihama et al. | |
| 2007/0034856 A1* | 2/2007 | Ohsawa | H01L 51/5048 257/13 |
| 2007/0042541 A1* | 2/2007 | Izumi | H01L 27/10852 438/238 |
| 2007/0045805 A1* | 3/2007 | Watanabe | G06K 19/07749 257/686 |
| 2007/0108472 A1 | 5/2007 | Jeong et al. | |
| 2007/0138941 A1* | 6/2007 | Jin | H01L 27/3232 313/503 |
| 2007/0200112 A1* | 8/2007 | Yamazaki | H01L 51/5278 257/72 |
| 2007/0215867 A1* | 9/2007 | Kawakami | C07C 211/61 257/40 |
| 2008/0213579 A1* | 9/2008 | Lee | B05D 1/60 428/339 |
| 2008/0277660 A1* | 11/2008 | Tsurume | G01R 31/2884 257/48 |
| 2008/0284768 A1* | 11/2008 | Yoshida | G09G 3/2022 345/208 |
| 2008/0303431 A1 | 12/2008 | Aiba et al. | |
| 2009/0001453 A1* | 1/2009 | Richter | H01L 21/823807 257/327 |
| 2009/0072719 A1* | 3/2009 | Kwon | H01L 23/3192 313/504 |
| 2009/0114926 A1* | 5/2009 | Yamazaki | G09G 3/3208 257/79 |
| 2009/0261414 A1* | 10/2009 | Oikawa | H01L 21/568 257/347 |
| 2009/0289258 A1* | 11/2009 | Kim | H01L 29/66765 257/66 |
| 2010/0032668 A1* | 2/2010 | Yamazaki | H01L 29/78621 257/43 |
| 2010/0038641 A1 | 2/2010 | Imai et al. | |
| 2010/0102315 A1* | 4/2010 | Suzawa | H01L 27/1225 257/43 |
| 2010/0105162 A1* | 4/2010 | Suzawa | H01L 27/1214 438/104 |
| 2010/0105163 A1* | 4/2010 | Ito | H01L 27/1214 438/104 |
| 2010/0105164 A1* | 4/2010 | Ito | H01L 27/1214 438/104 |
| 2010/0123160 A1* | 5/2010 | Hatano | H01L 27/3251 257/99 |
| 2010/0219717 A1* | 9/2010 | Takai | H03H 9/02937 310/313 C |
| 2010/0244693 A1* | 9/2010 | Kawakami | C07C 211/61 315/32 |
| 2011/0120755 A1* | 5/2011 | Lee | H01L 27/1214 174/254 |
| 2011/0139747 A1* | 6/2011 | Lee | H01L 51/0096 216/37 |
| 2011/0193067 A1* | 8/2011 | Lee | H01L 51/5256 257/40 |
| 2011/0223697 A1* | 9/2011 | Yong-Hwan | H01L 27/1266 438/28 |

FOREIGN PATENT DOCUMENTS

| | | |
|---|---|---|
| JP | 2004-292877 | 10/2004 |
| JP | 2005512299 A | 4/2005 |
| JP | 2007-042467 | 2/2007 |
| JP | 2009018569 A | 1/2009 |
| JP | 200932464 A | 2/2009 |
| KR | 10-2001-0101231 A | 11/2001 |
| KR | 10-2005-0047539 A | 5/2005 |
| KR | 10-2005-0108524 A | 11/2005 |
| KR | 10-2006-0007637 | 1/2006 |
| WO | 2009014066 A1 | 1/2009 |

OTHER PUBLICATIONS

Notice of Allowance issued by Korean Patent Office on Dec. 26. 2011 corresponding to Korean Patent Application No. 10-2010-0012018 was cited by Applicants in U.S. Appl. No. 12/895,315.

Japanese Office Action issued by Japanese Patent Office on July 29, 2014 in corresponding Japanese Patent Application No. 2010-270085 and Request for Entry of the Accompanying Office Action attached herewith.

* cited by examiner

US 9,324,776 B2

ORGANIC LIGHT-EMITTING DEVICE INCLUDING BARRIER LAYER INCLUDING SILICON OXIDE LAYER AND SILICON NITRIDE LAYER

CLAIM OF PRIORITY

This application is a continuation of U.S. application Ser. No. 13/754,405, filed on 30 Jan. 2013, the disclosure of which is incorporated herein in its entirety by reference. U.S. application Ser. No. 13/754,405 is, in turn, a continuation-in-part of U.S. application Ser. No. 12/895,315, filed on 30 Sep. 2010, the disclosure of which is incorporated herein in its entirety by reference.

This application also claims the benefit of Korean Patent Application No. 10-2010-0012018, filed on 9 Feb. 2010 in the Korean Intellectual Property Office, the disclosure of which is incorporated herein in its entirety by reference.

BACKGROUND OF THE INVENTION

1. Field of the Invention

The present invention relates to an organic light-emitting device including a barrier layer that includes a silicon oxide layer and a silicon-rich silicon nitride layer.

2. Description of the Related Art

As flexible flat display devices have recently attracted increasing attention, research is being actively conducted on flexible flat display devices. Flexible flat display devices are manufactured by using a flexible substrate formed of a flexible material such as plastic, and not a glass substrate.

A flat display device includes a thin film transistor (TFT) for controlling the operation of each pixel or generating an electrical signal to be provided to a driving unit. It is necessary to protect the TFT from external impurities.

Since an organic light-emitting device, on which research has also recently been actively conducted in connection with a display unit of a flexible flat display device, includes an electronic light-emitting element, in each pixel, which is formed of an organic material that is very vulnerable to external moisture or oxygen, it is necessary to prevent external impurities from penetrating into the organic material.

A barrier layer, which is used to prevent the penetration of external impurities, may peel off during a process.

SUMMARY OF THE INVENTION

The present invention provides an organic light-emitting device that may reduce a water vapor transmission rate and prevent a barrier layer from peeling off.

According to an aspect of the present invention, there is provided an organic light-emitting device including: a plastic film; a barrier layer; a thin film transistor (TFT); and an organic field emission layer; wherein the barrier layer includes a silicon oxide layer and a silicon nitride layer including SiNx (where x=about 1.1 to about 1.3), and the barrier layer is disposed between the plastic film and the TFT.

A refractive index of the silicon nitride layer may range from about 1.81 to about 1.85.

A stress of the silicon nitride layer may range from about −200 MPa to about 0 MPa.

The barrier layer may include a plurality of the silicon oxide layers and a plurality of the silicon nitride layers which are alternately disposed.

A thickness of the silicon nitride layer may range from about 20 nm to about 80 nm.

A thickness of the silicon oxide layer may range from about 100 nm to about 500 nm.

A thickness of the barrier layer may range from about 120 nm to about 2000 nm.

The barrier layer may have a structure in which the silicon nitride layer, the silicon oxide layer, the silicon nitride layer, the silicon oxide layer, the silicon nitride layer, the silicon oxide layer, and the silicon nitride layer are alternately stacked, wherein each of the silicon nitride layers includes SiNx (where x=about 1.1 to about 1.3).

The silicon oxide layer may be a silicon-rich oxide layer.

The silicon oxide layer may be a silicon-rich oxide layer.

According to another aspect of the present invention, there is provided an organic light-emitting device including: a plastic film; a first barrier layer that is formed on the plastic film and includes a first silicon oxide layer and a first silicon nitride layer; a second barrier layer that is formed on the first barrier layer and includes a second silicon oxide layer and a second silicon nitride layer; a thin film transistor (TFT) that is formed on the second barrier layer; and an organic field emission layer that is formed on the second barrier layer and is connected to the TFT, wherein the second silicon oxide layer is closer to the TFT than the second silicon nitride layer is.

The first silicon nitride layer and the second silicon nitride layer may be disposed adjacent to each other.

The organic light-emitting device may further include a silicon oxynitride layer that is disposed between the first silicon nitride layer and the second silicon nitride layer.

The first barrier layer may include the first silicon oxide layer and the first silicon nitride layer which are sequentially disposed on the plastic film.

The organic light-emitting device may further include a silicon nitride layer that is disposed between the plastic film and the first silicon oxide layer.

The organic light-emitting device may further include a silicon oxynitride layer that is disposed between the first silicon nitride layer and the second silicon nitride layer.

Two or more first silicon oxide layers and two or more first silicon nitride layers may be disposed.

A total thickness of silicon nitride layers included in the first barrier layer and the second barrier layer may be less than a total thickness of silicon oxide layers included in the first barrier layer and the second barrier layer.

According to another aspect of the present invention, there is provided a method of manufacturing an organic light-emitting device, the method including: a first process of forming a first barrier layer including a first silicon oxide layer and a first silicon nitride layer on a plastic film, and a second process of forming a second barrier layer including a second silicon oxide layer and a second silicon nitride layer and a TFT on the first barrier layer, wherein the second silicon oxide layer is closer to the TFT than the second silicon nitride layer is, and the first process and the second process are performed in different process chambers.

The first process and the second process may be performed in chambers having different vacuum degrees.

The method may further include a preheating process of preheating the plastic film before the first process.

In the preheating process, a preheating time when the first silicon nitride layer is directly formed on the plastic film is longer than a preheating time when the first silicon oxide layer may be directly formed on the plastic film.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A flexible display panel is manufactured by coating plastic on a glass substrate, depositing a barrier layer on the plastic, forming a thin film transistor (TFT) backplane, performing electroluminescence (EL) evaporation and thin film encapsulation, and detaching a plastic panel from the glass substrate. A plastic substrate used for the flexible display panel has a higher water vapor transmission rate than a glass substrate, and thus may have a shorter lifetime of an EL unit than the glass substrate. In general, glass has a water vapor transmission rate of less than $1E-6$ $g/m^2/day$ and plastic has a water vapor transmission rate of more than $1E-1$ $g/m^2/day$.

Accordingly, in order to protect the EL unit from moisture output from the plastic substrate, a barrier layer is disposed. A barrier layer may be formed by alternately depositing $SiN_x$ (N) and $SiO_2$ (O) through plasma-enhanced chemical vapour deposition (PECVD) in the form of NONONON where N has a thickness of approximately 50 nm and O has a thickness of approximately 300 nm. A barrier layer generally has a water vapor transmission rate of less than about $1E-3$ $g/m^2/day$. If the barrier layer has a total thickness of about 1050 nm and is subject to stress, the glass substrate may warp and the barrier layer may peel off from the glass substrate.

To solve the problems, there is provided an organic light-emitting device including an organic EL unit and a barrier layer that includes a silicon oxide layer and a silicon-rich silicon nitride layer.

The present invention will now be described more fully with reference to the accompanying drawings, in which exemplary embodiments of the invention are shown.

Figure 1:
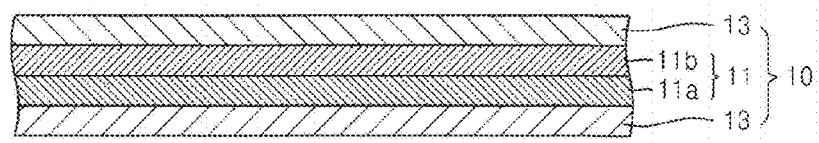
FIG. 1 is a cross-sectional view of a flexible substrate included in an organic light-emitting device, according to an embodiment of the present invention.

FIG. 1 is a cross-sectional view of a flexible substrate 10 included in an organic light-emitting device, according to an embodiment of the present invention.

Referring to FIG. 1, the flexible substrate 10 includes a barrier layer 11 and plastic films 13 disposed under and over the barrier layer 11. The barrier layer 11 includes a silicon-rich silicon nitride layer 11a and a silicon oxide layer 11b. An order in which the silicon-rich silicon nitride layer 11a and the silicon oxide layer 11b are stacked is not limited to that shown in FIG. 1, and the silicon oxide layer 11b may be first formed and then the silicon-rich silicon nitride layer 11a may be stacked on the silicon oxide layer 11b. Since an adhesive force between the silicon oxide layer 11b and the plastic films 13 is higher than an adhesive force between the silicon-rich silicon nitride layer 11a and the plastic films 13, if the silicon oxide layer 11b is first formed on the plastic films 13, peeling-off between the flexible substrate 10 and the barrier layer 11 may be reduced.

However, as shown in FIG. 1, even when the silicon-rich silicon nitride layer 11a is first formed on the plastic films 13, an adhesive force between the silicon-rich silicon nitride layer 11a and the plastic films 13 may be increased by appropriately increasing a preheating time of the plastic films 13 before the silicon-rich silicon nitride layer 11a is formed on the plastic films 13.

For example, assuming that a plastic film including polyimide was formed on a glass substrate, curing and cleaning were performed, the plastic film was preheated in a preheating chamber at about 250° C. to about 450° C., and a silicon nitride layer and a silicon oxide layer were deposited on the plastic film at about 400° C. by using PECVD, 1) an adhesive strength when the plastic film was preheated in the preheating chamber for about 50 seconds and then the silicon oxide layer was first deposited on the plastic film was about 5.5 N/cm, and 2) an adhesive strength when the plastic film was preheated in the preheating chamber for about 50 seconds and the silicon nitride layer was first deposited on the plastic film was about 4.3 N/cm. However, an adhesive strength when the plastic film was preheated in the preheating chamber for about 400 seconds and the silicon nitride layer was first deposited on the plastic film was about 6.1 N/cm. Accordingly, it is found that when a preheating time of the plastic film is appropriately increased, an adhesive force between the silicon nitride layer and the plastic film is improved.

The silicon-rich silicon nitride layer 11a has a refractive index of 1.81 to 1.85.

When the silicon-rich silicon nitride layer 11a has a refractive index of 1.81 to 1.85, the silicon-rich silicon nitride layer 11a has optimum moisture resistance.

Each of the silicon-rich silicon nitride layer 11a and the silicon oxide layer 11b of the barrier layer 11 may be formed by chemical vapour deposition (CVD), PECVD, or atomic layer deposition (ALD). However, the present invention is not limited thereto, and each of the silicon-rich silicon nitride layer 11a and the silicon oxide layer 11b of the barrier layer 11 may be formed by other methods.

For example, the silicon-rich silicon nitride layer 11a may be manufactured by flowing $SiH_4$ at a flow rate of about 350 to about 550 sccm, NH at a flow rate of about 1800 to about 2200 sccm, and $N_2$ at a flow rate of about 9000 to about 11000 sccm. In this case, the silicon-rich silicon nitride layer 11a has a stress of less than about −200 Mpa to about 0 Mpa.

A stress may be calculated by detecting a difference between the warp of a glass substrate when a silicon-rich silicon nitride layer is deposited on the glass substrate to, for example, a thickness of about 200 nm by flowing $SiH_4$ at a flow rate of about 350 to about 550 sccm, $NH_3$ at a flow rate of about 1800 to about 2200 sccm, and $N_2$ at a flow rate of about 9000 to about 11000 sccm and the warp of a glass substrate when a silicon-rich silicon nitride layer is deposited on the glass substrate to a thickness of about 200 nm by flowing $SiH_4$ at a flow rate of about 100 to about 300 sccm. $NH_3$ at a flow rate of about 1800 to about 2200 sccm, and $N_2$ at a flow rate of about 9000 to about 11000 sccm.

A surface roughness when the plastic films 13 may be disposed under and over the barrier layer 11 may be less than that when a TFT is formed on the plastic substrate 10 including only the barrier layer 11. The plastic films 13 may be formed by laminating a plastic material on a bottom surface and a top surface of the barrier layer 11 with a hot roll laminator. However, the present invention is not limited thereto, and the plastic films 13 may be formed by other methods. For example, the flexible substrate 10 may be manufactured by sequentially forming the silicon-rich silicon nitride layer 11a and the silicon oxide layer 11b on one of the plastic films 13 in the order stated and then forming the other plastic film 13 on the silicon oxide layer 11b. The present embodiment is not limited thereto, and although not shown in FIG. 1, the plastic films 13 may be formed on one side of the barrier layer 11, that is, only under the barrier layer 11. In this case, the TFT may be directly formed on the barrier layer 11 instead of the plastic films 13. That is, the barrier layer 11 may be formed on the plastic films 13 and the TFT may be formed on the barrier layer 11.

The silicon-rich silicon nitride layer 11a of the barrier layer 11 of the flexible substrate 10 reduces water vapor transmission and the silicon oxide layer 11b ensures stress balances.

Figure 2:
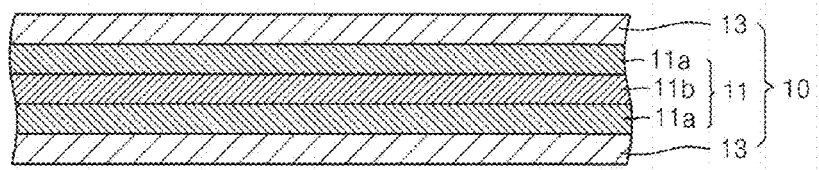
FIG. 2 is a cross-sectional view illustrating a flexible substrate according to another embodiment of the present invention.

Although the barrier layer 11 includes one silicon-rich silicon oxide layer and one silicon oxide layer in FIG. 1, the barrier layer 11 may include two silicon-rich silicon nitride layers disposed on both sides of one silicon oxide layer as shown in FIG. 2. Alternatively, two silicon oxide layers may be disposed on both sides of one silicon-rich silicon nitride layer. By contrast, the barrier layer 11 may include two silicon oxide layers disposed on both sides of one silicon-rich silicon nitride layer. Even in this case, the plastic films 13 may be formed on only one side of the barrier layer 11, not both sides of the barrier layer 11.

Figure 3:
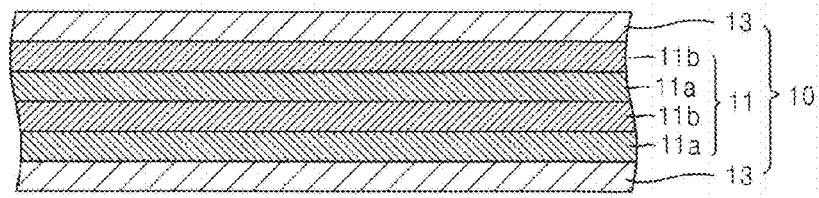
FIG. 3 is a cross-sectional view illustrating a flexible substrate according to another embodiment of the present.

Alternatively, the barrier layer 11 may have a structure in which a plurality of the silicon-rich silicon nitride layers 11a and a plurality of the silicon oxide layers 11b are alternately disposed on each other as 4 layers, as shown in FIG. 3. For example, as shown in FIG. 3, the silicon-rich silicon nitride layer 11a, the silicon oxide layer 11b, the silicon-rich silicon nitride layer 11a, and the silicon oxide layer 11b of the barrier layer 11 may be sequentially stacked. Also, an order in which the silicon-rich silicon nitride layers 11a and the silicon oxide layers 11b are stacked may be changed. That is, the silicon oxide layer 11b may be first formed on the barrier layer 11, and then the silicon-rich silicon nitride layer 11a, the silicon oxide layer 11b, and the silicon-rich silicon nitride layer 11a may be sequentially stacked. Also, even in this case, the plastic films 13 may be formed on only one side of the barrier layer 11, not both sides of the barrier layer 11.

Also, the silicon-rich silicon nitride layers 11a and the silicon oxide layers 11b constituting the barrier layer 11 may be alternately disposed as more than 4 layers. For example, referring to FIG. 9, the flexible substrate 10 may have a structure in which the silicon-rich silicon nitride layer 11a, the silicon oxide layer 11b, the silicon-rich silicon nitride layer 11a, the silicon oxide layer 11b, the silicon-rich silicon nitride layer 11a, the silicon oxide layer 11b, and the silicon-rich silicon nitride layer 11a are sequentially stacked on the plastic films 13 as 7 layers. The silicon-rich silicon nitride layers 11a directly formed on the plastic films 13 may increase an adhesive force between the silicon-rich silicon nitride layer 11a and the plastic films 13 by appropriately increasing a preheating time of the plastic films 13. The silicon oxide layers 11b may ensure stress balances, the plurality of silicon-rich silicon nitride layers 11a may prevent impurities from being diffused, and the barrier layer 11 may prevent water vapor transmission.

Figure 9:
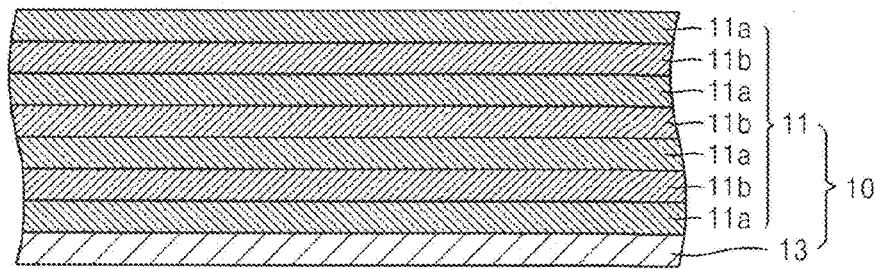
FIG. 9 is a cross-sectional view illustrating a flexible substrate according to another embodiment of the present invention.

Although the barrier layer 11 includes in total 7 inorganic layers that is, the silicon-rich silicon nitride layers 11a and the silicon oxide layers 11b which are alternately formed in FIG. 9, the present embodiment is not limited thereto. The barrier layer 11 may be formed by alternately forming 5 or 6 inorganic layers. For example, although not shown, the silicon-rich silicon nitride layer 11a, the silicon oxide layer 11b, the silicon-rich silicon nitride layer 11a, the silicon oxide layer 11b, and the silicon-rich silicon nitride layer 11a may be sequentially stacked on the plastic films 13 to form the barrier layer 11. Also, an order in which the silicon-rich silicon nitride layers 11a and the silicon oxide layers 11b are stacked may be changed. Also, although not shown, the barrier layer 11 may be formed by sequentially stacking the silicon-rich silicon nitride layers 11a and the silicon oxide layers 11b as 6 layers.

Alternatively, the plurality of silicon-rich silicon nitride layers 11a and the plurality of silicon oxide layers 11b may not be alternately stacked.

Figure 10:
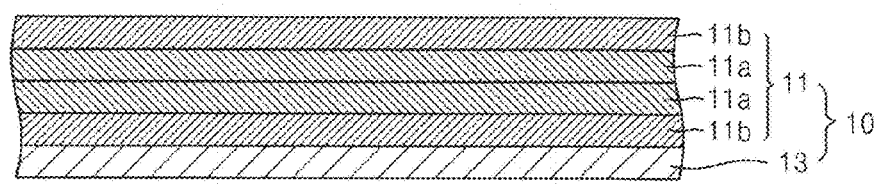
FIG. 10 is a cross-sectional view illustrating a flexible substrate according to another embodiment of the present invention.

FIG. 10 is a cross-sectional view illustrating the flexible substrate 10 included in the organic light-emitting device, according to another embodiment of the present invention. Referring to FIG. 10, the silicon oxide layer 11b, the silicon-rich silicon nitride layer 11a, the silicon-rich silicon nitride layer 11a, and the silicon oxide layer 11b may be sequentially stacked on the plastic films 13 as 4 layers, that is, in the form of ONNO.

The silicon oxide layers 11b from among a plurality of inorganic layers of the barrier layer 11 contact the plastic films 13. Since an adhesive force between the silicon oxide layer 11b and the plastic films 13 is higher than an adhesive force between the silicon-rich silicon nitride layer 11a and the plastic films 13, peeling-off may be prevented by first depositing the silicon oxide layer 11b on the plastic films 13. Although not shown in FIG. 9, a TFT (see FIG. 13) of the organic light-emitting device may be formed on the barrier layer 11. Deviations in characteristics of the TFT due to a defect site included in the silicon-rich silicon nitride layer 11a may be prevented by making the silicon oxide layer 11b as an uppermost layer of the barrier layer 11. Although a top gate TFT including a semiconductor layer 31, a gate electrode 33, a source electrode 35, and a drain electrode 36 is disposed on the flexible substrate 10 in FIG. 13, the present embodiment is not limited thereto. Various TFTs including a bottom gate TFT of FIG. 5 may be used.

Figure 11:
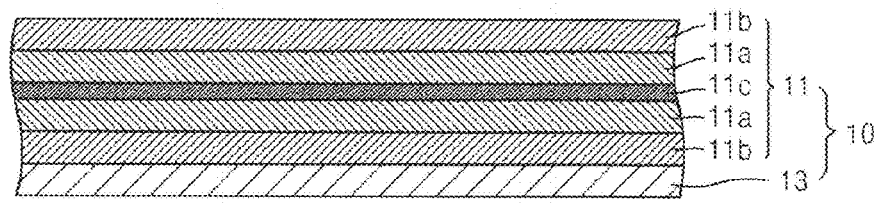
FIG. 11 is a cross-sectional view illustrating a flexible substrate according to another embodiment of the present invention.

The plurality of silicon-rich silicon nitride layers 11a and the plurality of silicon oxide layers 11b constituting the barrier layer 11 may be deposited in the same process chamber or different process chambers. For example, lower two layers (hereinafter, referred to as a first barrier layer) and upper two layers (hereinafter, referred to as a second barrier layer) of the barrier layer 11 of FIG. 10 may be deposited in different process chambers. When a non-continuous process of forming the first barrier layer on the plastic films 13 in a first process chamber and forming the second barrier layer in a second process chamber is performed, a surface of the silicon-rich silicon nitride layer 11a which is an uppermost layer of the first barrier layer is oxidized during the non-continuous process. Referring to FIG. 11, a silicon oxynitride (SiOxNy) layer 11c is formed on the silicon-rich silicon nitride layer 11a of the first barrier layer formed in the first process chamber. The silicon oxynitride layer 11c has excellent moisture control and thus may increase a moisture resistance of the barrier layer 11.

Figure 12:
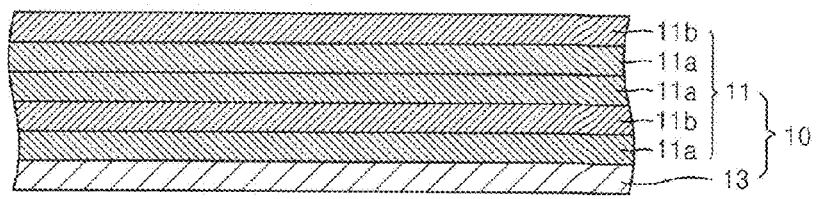
FIG. 12 is a cross-sectional view illustrating a flexible substrate according to another embodiment of the present invention.

FIG. 12 is a cross-sectional view illustrating that the barrier layer 11 has a structure in which inorganic layers are not alternately stacked, according to another embodiment of the present invention. Referring to FIG. 12, the flexible substrate 10 has a structure in which the silicon-rich silicon nitride layer 11a, the silicon oxide layer 11b, the silicon-rich silicon nitride layer 11a, the silicon-rich silicon nitride layer 11a, and the silicon oxide layer 11b are sequentially stacked on the plastic films 13 as 5 layers in the form of NONNO. In this case, an adhesive force between the plastic films 13 and the silicon-rich silicon nitride layer 11a may be increased by appropriately increasing a preheating time of the plastic films 13 before the first silicon-rich silicon nitride layer 11a is formed on the plastic films 13. Also, deviations in characteristics of a TFT due to a defect site included in the silicon-rich silicon nitride layer 11a may be prevented by making the silicon oxide layer 11b as an uppermost layer of the barrier layer 11. When a non-continuous process of forming the barrier layer 11 of FIG. 12 is performed, for example, lower three layers (hereinafter, referred to as a first barrier layer) and upper two layers (hereinafter, referred to as a second barrier layer) of the barrier layer 11 of FIG. 12 may be non-continuously formed in different process chambers. Even in this case, although not shown, a surface of the silicon-rich silicon nitride layer 11a which is an uppermost layer of the first barrier layer may be oxidized to form the silicon oxynitride layer 11c.

Also, although not shown, the flexible substrate 10 may include the barrier layer 11 having a ONONNO structure in which the silicon oxide layer 11b, the silicon-rich silicon nitride layer 11a, the silicon oxide layer 11b, the silicon-rich silicon nitride layer 11a, the silicon-rich silicon nitride layer 11a, and the silicon oxide layer 11b are sequentially stacked on the plastic films 13, or the barrier layer 11 having a NONONNO structure in which the silicon-rich silicon nitride layer 11a, the silicon oxide layer 11b, the silicon-rich silicon nitride layer 11a, the silicon oxide layer 11b, the silicon-rich silicon nitride layer 11a, the silicon-rich silicon nitride layer 11a, and the silicon oxide layer 11b are sequentially stacked on the plastic films 13.

The previous structures and structures of FIGS. 10 through 12 share a common feature in that an uppermost layer of the barrier layer 11, that is, a layer closest to the TFT, is the silicon oxide layer 11b.

Also, the structures and the structures of FIGS. 10 through 12 share another common feature in that there is at least one section where the silicon-rich silicon nitride layer 11a and the silicon oxide layer are not alternately stacked. In particular, when two silicon-rich silicon nitride layers 11a are continuously deposited and a process of forming the two silicon-rich silicon nitride layers 11a is a non-continuous process in which process chambers are different, the silicon oxynitride layer 11c may be formed between the two silicon-rich silicon nitride layers 11a.

As described above, the number of the silicon-rich silicon nitride layers 11a and the silicon oxide layers 11a constituting the barrier layer 11 may be increased from at least 2 to 7. Also, the number of the silicon-rich silicon nitride layers 11a and the silicon oxide layers 11a constituting the barrier layer 11 may be higher than 7. However, as the number of layers is increased, a thickness of the barrier layer 11 is increased. Once the thickness of the barrier layer 11 is increased, although a water vapor transmission rate of the flexible substrate 10 may be reduced, it may be difficult to manufacture the flexible substrate 10 which is soft.

Since the plastic films 13 used for the flexible substrate 10 are vulnerable to heat, it is difficult to perform a high temperature process. As a deposition temperature is increased, a film density of the silicon-rich silicon nitride layer 11a and the silicon oxide layer 11b constituting the barrier layer 11 is increased and a water vapor transmission rate is reduced. Accordingly, since a water vapor transmission rate of the barrier layer 11 during a low temperature process is low and thus a thickness of the barrier layer 11 has to be great, a softness of the flexible substrate 10 may be reduced. As a material of the plastic films 13 which may endure a high temperature process has recently been developed, a deposition temperature of the barrier layer 11 has been increased from about 205° C. to about 400° C. to 450° C. Accordingly, even when the barrier layer 11 includes 2 to 7 layers, a softness may be maintained and a water vapor transmission rate may be reduced.

When the plastic films 13 are disposed under and over the barrier layer 11, as described above, in order to increase an adhesive force between the plastic films 13 and the barrier layer 11, an adhesive layer 12 may be disposed between the barrier layer 11 and the n plastic films 13. The position of the adhesive layer 12 is not limited to that shown in FIG. 4, and the adhesive layer 12 may be disposed on at least one of the spaces between the barrier layer 11 and the plastic films 13.

The silicon-rich silicon nitride layer 11a may have a thickness of about 20 nm to about 80 nm, and the silicon oxide layer 11b may have a thickness of about 100 nm to about 500 nm.

If the silicon-rich silicon nitride layer 11a has a thickness of about 20 nm to about 80 nm and the silicon oxide layer 11b has a thickness of about 100 nm to about 500 nm, the silicon-rich silicon nitride layer 11a and the silicon oxide layer 11b may have an optimum moisture resistance and stress balance.

Although the silicon-rich silicon nitride layer 11a and the silicon oxide layer 11b have the same thickness for convenience in the previous embodiments, a thickness of the silicon-rich silicon nitride layer 11a may be less than a thickness of the silicon oxide layer 11b. Also, a total thickness of the silicon-rich silicon nitride layers 11a constituting the barrier layer 11 may be less than a total thickness of the silicon oxide layers 11b constituting the barrier layer 11, in order to prevent deviations in characteristics of a TFT due to a defect site included in the silicon-rich silicon nitride layer 11a.

The barrier layer 11 may have a thickness of about 120 nm to about 2000 nm in consideration of a total thickness of the organic light-emitting device, moisture resistance, and warp prevention.

The barrier layer 11 may have a structure in which a silicon-rich silicon nitride layer, a silicon oxide layer, a silicon-rich silicon nitride layer, a silicon oxide layer, a silicon-rich silicon nitride layer, a silicon oxide layer, and a silicon-rich silicon nitride layer are stacked.

The silicon oxide layer 11b may be a silicon-rich silicon oxide layer.

Figure 4:
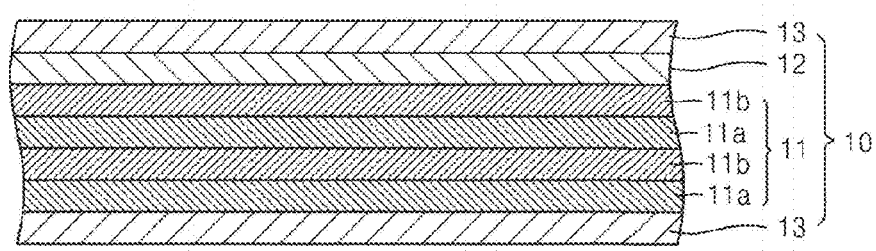
FIG. 4 is a cross-sectional view illustrating a flexible substrate according to another embodiment of the present invention.
Figure 5:
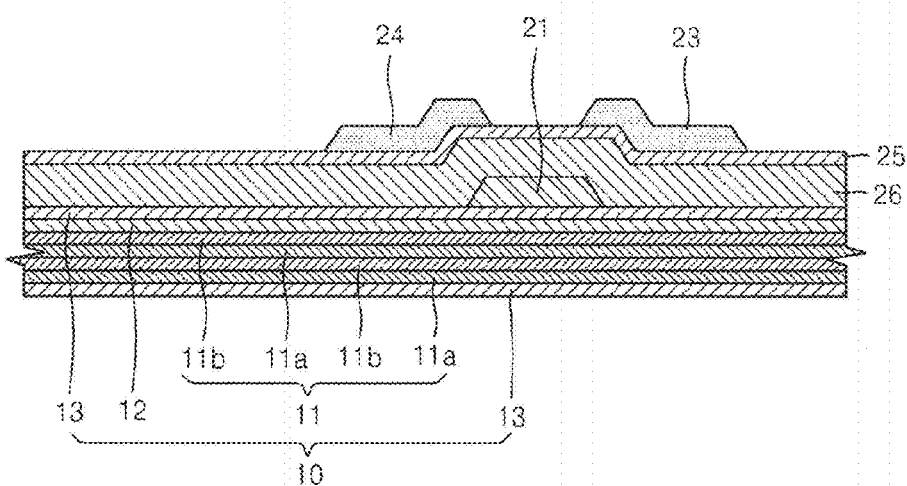
FIG. 5 is a cross-sectional view illustrating a thin film transistor (TFT) substrate including the flexible substrate of FIG. 1.

FIG. 5 is a cross-sectional view of a TFT disposed on the flexible substrate 10 of FIG. 4, according to an embodiment of the present invention.

Referring to FIG. 5, the TFT, including a gate electrode 21, a source electrode 23, a drain electrode 24, a semiconductor layer 25, and a gate insulating layer 26, is disposed on the flexible substrate 10, including the adhesive layer 12, of FIG. 4.

Since the TFT, particularly, an organic TFT, is vulnerable to external impurities, such as external moisture or oxygen, as described above, the TFT may be protected by any of the flexible substrates 10 of FIGS. 1 through 4 and FIGS. 9 through 12. Also, even when the TFT is a TFT including the semiconductor layer 25 formed of polysilicon or amorphous silicon, the TFT may be protected by any of the flexible substrates 10 of FIGS. 1 through 4 and FIGS. 9 through 12. Also, although a bottom gate TFT is illustrated in FIG. 5, the present embodiment is not limited thereto and any of various TFTs may be used.

Figure 6:
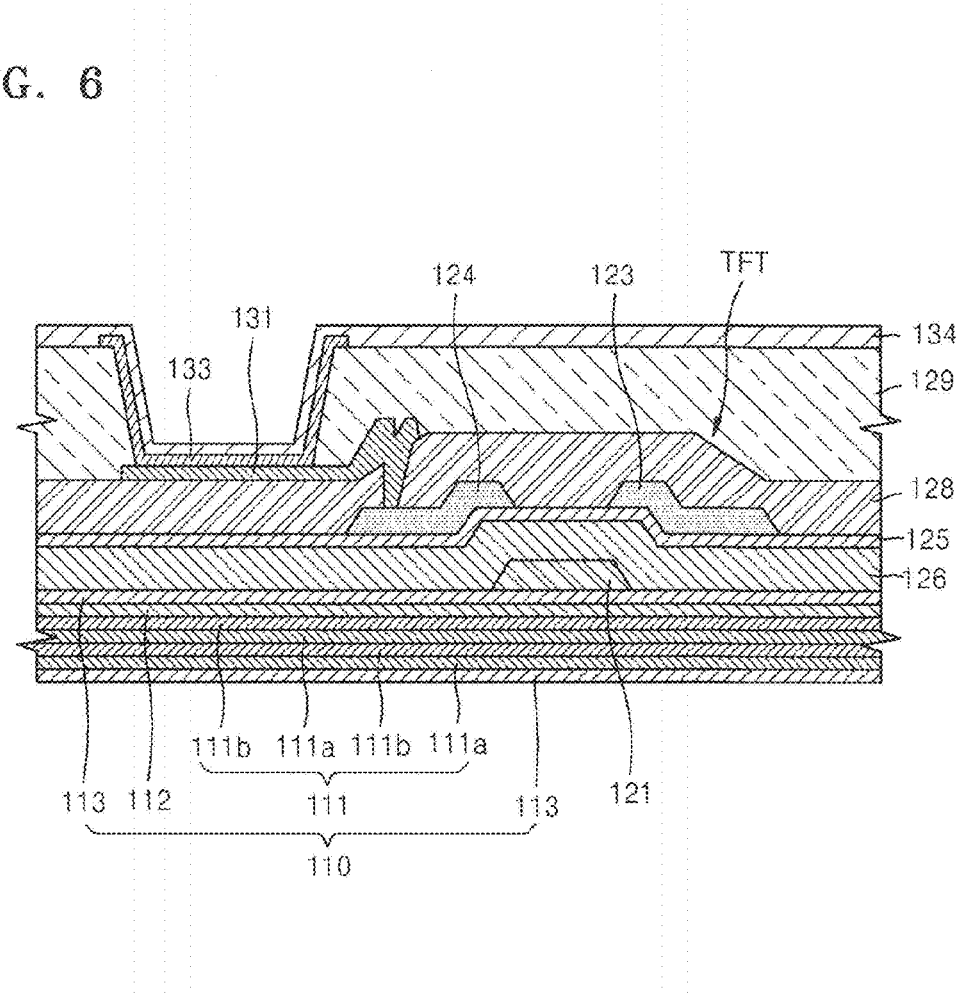
FIG. 6 is a cross-sectional view illustrating an organic light-emitting device including the TFT substrate of FIG. 5.

FIG. 6 is a cross-sectional view of an organic light-emitting device according to an embodiment of the present invention.

Among various types, the organic light-emitting device of FIG. 6 may be an active matrix (AM) light-emitting display device including an organic TFT.

Each sub-pixel includes at least one organic TFT as shown in FIG. 6. Referring to FIG. 6, an organic TFT is disposed on such a flexible substrate 110 as shown in any of FIGS. 1 through 4. The type of a TFT is not limited to the one shown in FIG. 6, and various TFTs, including a silicon TFT, may be used.

A passivation layer 128 formed of $SiO_2$ is formed on the organic TFT, and a pixel defining layer 129 formed of acryl, polyimide, or the like is formed on the passivation layer 128. The passivation layer 128 may protect the organic TFT, and planarize a top surface of the organic TFT.

Although not shown, at least one capacitor may be connected to the organic TFT. A circuit including the organic TFT is not limited to the one shown in FIG. 6, and various modifications may be made.

An organic light-emitting element is connected to a drain electrode 124. The organic light-emitting element includes a pixel electrode 131 and a counter electrode 134, which face each other, and an intermediate layer 133 including at least one light-emitting layer and disposed between the pixel electrode 131 and the counter electrode 134. The counter electrode 134 may be modified in various ways, for example, may be shared by a plurality of pixels.

Although the intermediate layer 133 is patterned to correspond to only one sub-pixel in FIG. 6 for convenience of explanation of the construction of a sub-pixel, the intermediate layer 133 may be integrally formed with an intermediate layer of an adjacent sub-pixel. Alternatively, some of a plurality of the intermediate layers 133 may be formed to respectively correspond to sub-pixels and the remaining ones of the plurality of intermediate layers 133 may be integrally formed with intermediate layers of neighbouring sub-pixels.

The pixel electrode 131 acts as an anode and the counter electrode 134 acts as a cathode. Alternatively, the pixel electrode 131 may act as a cathode and the counter electrode 134 may act as an anode.

The pixel electrode 131 is a reflective electrode. That is, the flexible substrate 110 includes a barrier layer 111 that includes silicon-rich silicon nitride layers 111a and silicon oxide layers 111b that are alternately stacked. Since the barrier layer 111 is opaque, light generated by the intermediate layer 133 is emitted through the counter electrode 134 away from the flexible substrate 110. Accordingly, the pixel electrode 131 is a reflective electrode and the counter electrode 134 is a transparent electrode.

Accordingly, the pixel electrode 131 may be formed by forming a reflective layer formed of silver (Ag), magnesium (Mg), aluminium (Al), platinum (Pt), lead (Pd), gold (Au), nickel (Ni), neodymium (Nd), iridium (Ir), chromium (Cr), or a compound thereof and forming indium tin oxide (ITO), indium zinc oxide (IZO), zinc oxide (ZnO), or $In_2O_3$ on the reflective layer. The counter electrode 134, which is a transparent electrode, may be formed by depositing lithium (Li), calcium (Ca), lithium fluoride/calcium (LiF/Ca), lithium fluoride/aluminium (LiF/Al), Al, Mg, or a compound thereof to face the intermediate layer 133, and forming an auxiliary electrode or a bus electrode line formed of a transparent electrode forming material such as ITO, IZO, ZnO, or $IN_2O_3$.

However, the present embodiment is not limited thereto. When the barrier layer 111 has a small thickness or has a high transmissivity by adjusting its composition, light generated in the intermediate layer 133 may be emitted toward the flexible substrate 110 by forming the pixel electrode 131 as a transparent electrode and the counter electrode 134 as a reflective electrode.

The intermediate layer 133 disposed between the pixel electrode 131 and the counter electrode 134 may be formed of a low molecular weight organic material or a high molecular weight organic material. If the intermediate layer 133 is formed of a low molecular weight organic material, the intermediate layer 133 may be formed by stacking a hole injection layer (HIL), a hole transport layer (HTL), an organic emission layer (EML), an electron transparent layer (ETL), and an electron injection layer (EIL) in a single structure or complex structure. Examples of the low molecular weight organic material of the intermediate layer 133 may include copper phthalocyanine (CuPc), N,N'-Di(naphthalene-1-yl)-N,N'-diphenyl-benzidine (NPB), and tris-8-hydroxyquinoline aluminum (Alq3). The low molecular weight organic materials are disposed by patterning and are formed by vacuum deposition using masks, as described above.

If the intermediate layer 133 is formed of a high molecular weight organic material, the intermediate layer 133 may have a structure including an HTL and an EML. The HTL may be formed of poly-(2,4)-ethylene-dihydroxy thiophene (PEDOT), and the EML may be formed of a high molecular weight organic material such as poly-phenylenevinylene (PPV) or polyfluorene.

The organic light-emitting element formed on the flexible substrate 110 is sealed by a counter member (not shown). The counter member may be formed of the same glass or plastic material as that of the flexible substrate 110. Alternatively, the counter member may be formed of a metal cap or the like.

Figure 13:
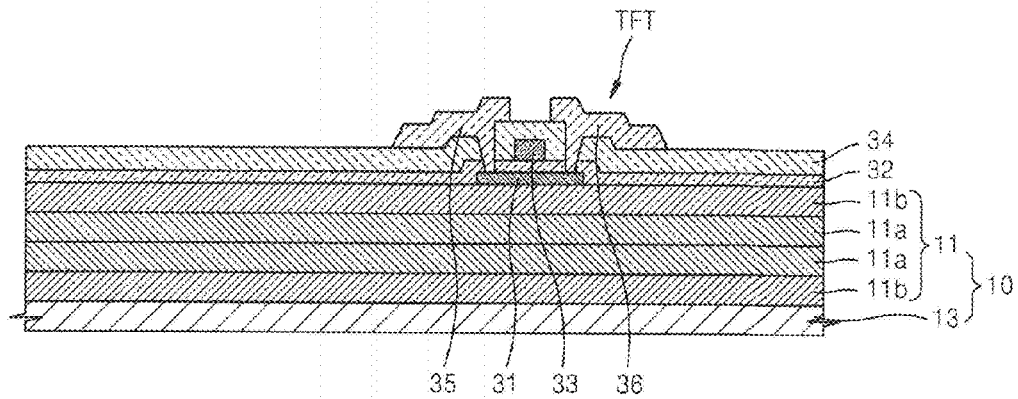
FIG. 13 is a cross-sectional view illustrating a TFT substrate including the flexible substrate of FIG. 10.

FIG. 13 is a cross-sectional view illustrating a TFT disposed on the flexible substrate 10 of FIG. 10.

Referring to FIG. 13, the TFT including the semiconductor layer 31, the gate electrode 33, the source electrode 36, and the drain electrode 35 is disposed on the flexible substrate 10 of FIG. 10. A gate insulating film 32 is disposed between the semiconductor layer 31 and the gate electrode 33, and an interlayer insulating film 34 is disposed between the gate electrode 33 and the source electrode 36 and between the gate electrode 33 and the drain electrode 35. The semiconductor layer 31 may be formed of polysilicon or amorphous silicon.

As described above, since an adhesive force between the silicon oxide layer 11b and the plastic films 13 is higher than an adhesive force between the silicon-rich silicon nitride layer 11a and the plastic films 13, peeling-off may be prevented by first depositing the silicon oxide layer 11b on the plastic films 13. Also, deviations in characteristics of the TFT due to a defect site included in the silicon-rich silicon nitride layer 11a may be prevented by making the silicon oxide layer 11b as an uppermost layer of the barrier layer 11.

Figure 14:
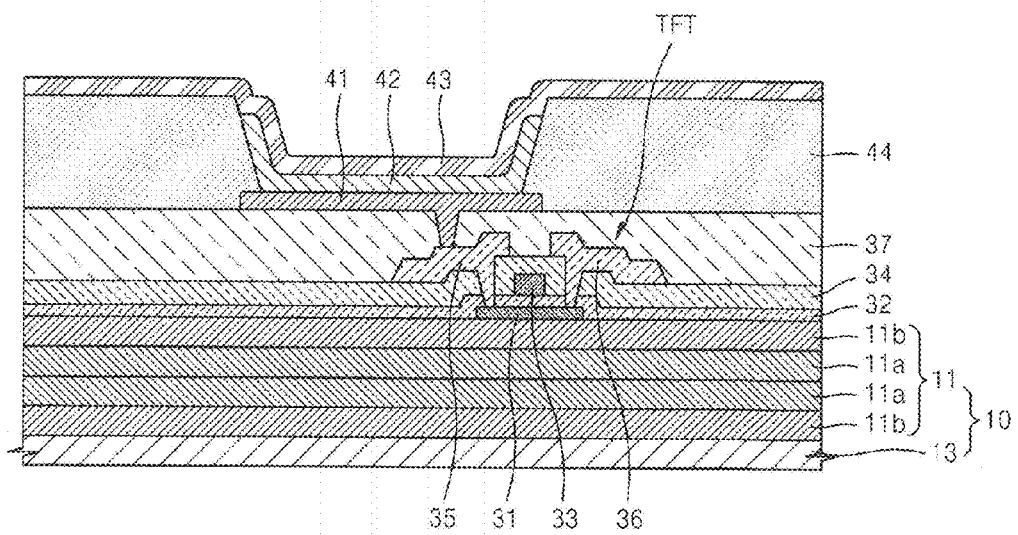
FIG. 14 is a cross-sectional view illustrating an organic light-emitting device including the TFT substrate of FIG. 14.

FIG. 14 is a cross-sectional view illustrating an organic light-emitting device according to another embodiment of the present invention.

Referring to FIG. 14, each sub-pixel of the organic light-emitting device may include a TFT disposed on the flexible substrate 10 of FIG. 13. In FIG. 14, the organic light-emitting device may be an active matrix (AM) organic light-emitting device including a top gate TFT as shown in FIG. 13.

A passivation layer 37 is formed on the TFT, and a pixel defining layer 44 is formed on the passivation layer 37. The passivation layer 37 may protect the TFT, and may planarize a top surface of the TFT.

An organic light-emitting element OLED is connected to the drain electrode 35. The organic light-emitting element OLED includes a pixel electrode 41, a counter electrode 43, and an intermediate layer 42 that includes at least a light-emitting layer disposed between the pixel electrode 41 and the counter electrode 43. The counter electrode 43 may be variously modified, for example, to be commonly formed for a plurality of pixels.

The pixel electrode 41 may function as an anode and the counter electrode 43 may function as a cathode, or vice versa. Also, at least one of the pixel electrode 41 and the counter electrode 43 may be a transparent electrode through which light emitted by the light-emitting layer may pass.

Although the organic light-emitting device has been explained, the present invention may be applied to various other flexible display devices.

Although an explanation will be made on the following examples in detail, the present invention is not limited thereto.

Comparison of Water Vapor Transmission Rate

Example 1

$SiH_4$ 400 sccm, $NH_3$ 2000 sccm, $N_2$ 10000 sccm

A barrier layer having a structure in which a silicon-rich silicon nitride layer, a silicon oxide layer, a silicon-rich silicon nitride layer, a silicon oxide layer, a silicon-rich silicon nitride layer, a silicon oxide layer, and a silicon-rich silicon nitride layer were stacked by PECVD was formed on a glass substrate, wherein each silicon-rich silicon nitride layer having a thickness of 50 nm was formed by flowing $SiH_4$ at a flow rate of 400 sccm, $NH_3$ at a flow rate of 2000 sccm, and $N_2$ at a flow rate of 10000 sccm, and each silicon oxide layer having a thickness of 300 nm was formed by flowing $SiH_4$ at a flow rate of 150 sccm, $N_2O$ at a flow rate of 3000 sccm, and Ar at a flow rate of 4000 sccm.

After performing Fourier transform infrared spectroscopy (FTIR), a ratio of Si to N of each silicon-rich silicon nitride layer was about 1:1.2.

Example 2

$SiH_4$ 500 sccm, $NH_3$ 2000 sccm, $N_2$ 10000 sccm

A barrier layer was formed in the same manner as Example 1 except that $SiH_4$ was flowed at a flow rate of 500 sccm.

Comparative Example 1

$SiH_4$ 100 sccm, $NH_3$ 2000 sccm, $N_2$ 10000 sccm

A barrier layer was formed in the same manner as Example 1 except that $SiH_4$ was flowed at a flow rate of 100 sccm.

Comparative Example 2

$SiH_4$ 200 sccm, $NH_3$ 2000 sccm, $N_2$ 10000 sccm

A barrier layer was formed in the same manner as Example 1 except that $SiH_4$ was flowed at a flow rate of 200 sccm.

Water vapor transmission rates of Examples 1 and 2 and Comparative Examples 1 and 2 are shown in Table 1.

Referring to Table 1, the water vapor transmission rates of the barrier layers of Examples 1 and 2 are similar to those of the barrier layers of Comparative Examples 1 and 2.

TABLE 1

| | Water Vapor Transmission Rate (WVTR) |
|---|---|
| Example 1 | ≤1E−3 $g/m^2/day$ |
| Example 2 | ≤1E−3 $g/m^2/day$ |
| Comparative Example 1 | ≤1E−3 $g/m^2/day$ |
| Comparative Example 2 | ≤1E−3 $g/m^2/day$ |

(conditions: WVTR, Mocon test, measurement limit: ≥1E−3 $g/m^2/day$)

(conditions: WVTR, Mocon test, measurement limit: ≥1E-3 $g/m^2/day$)

Observation of Peeling-off of Barrier Layer

Whether the barrier layers of Example 1 and Comparative Example 1 peeled off after being kept at room temperature for 2 weeks was observed.

Figure 7:
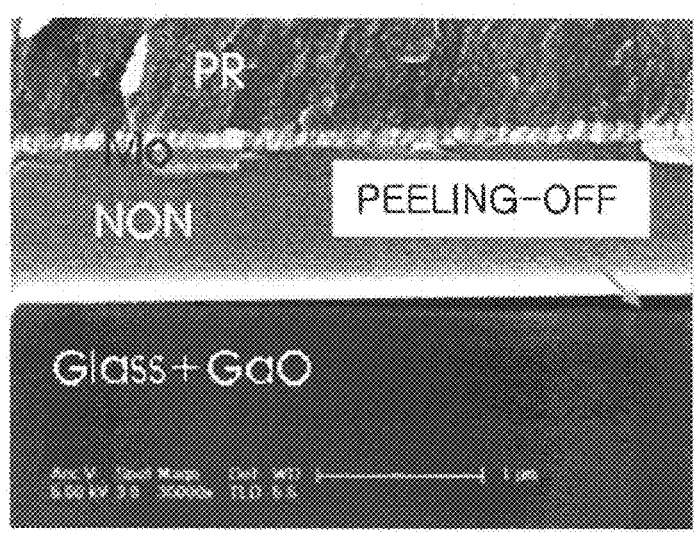
FIG. 7 is a transmission electron microscopic (TEM) photograph illustrating whether a barrier layer of Comparative Example 1 peeled off.

FIG. 7 is a transmission electron microscopic (TEM) photograph illustrating whether the barrier layer of Comparative Example 1 peeled off.

Figure 8:
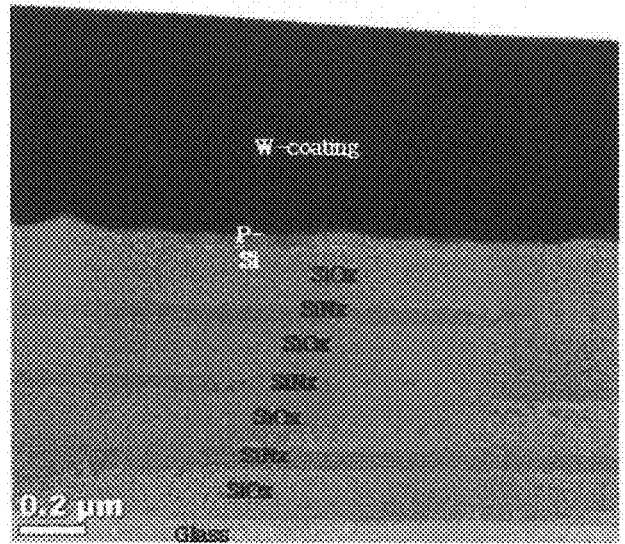
FIG. 8 is a TEM photograph illustrating whether a barrier layer of Example 1 peeled off.

FIG. 8 is a TEM photograph illustrating whether the barrier layer of Example 1 peeled off.

Referring to FIGS. 7 and 8, the barrier layer of Example 1 did not peel off, whereas the barrier layer of Comparative Example 1 peeled off.

Measurement of Stress of Silicon Nitride Layer

Example 3

$SiH_4$ 400 sccm, $NH_3$ 2000 sccm, $N_2$ 10000 sccm

A silicon-rich silicon nitride layer having a thickness of 100 nm was formed by PECVD on a glass substrate by flowing $SiH_4$ at a flow rate of 400 sccm, $NH_3$ at a flow rate of 2000 sccm, and $N_2$ at a flow rate of 10000 sccm.

Example 4

$SiH_4$ 500 sccm, $NH_3$ 2000 sccm, $N_2$ 10000 sccm

A silicon-rich silicon nitride layer was formed in the same manner as Example 3 except that $SiH_4$ was flowed at a flow rate of 500 sccm.

Comparative Example 3

$SiH_4$ 100 sccm, $NH_3$ 2000 sccm, $N_2$ 10000 sccm

A silicon nitride layer was formed in the same manner as Example 3 except that $SiH_4$ was flowed at a flow rate of 100 sccm.

Comparative Example 4

SiH₄ 200 sccm, NH₃ 2000 sccm, N₂ 10000 sccm

A silicon nitride layer was formed in the same manner as Example 3 except that SiH₄ was flowed at a flow rate of 200 sccm.

Refractive indexes and stresses of the silicon nitride layers of Examples 3 and and Comparative Examples 3 and 4 are shown in Table 2.

A stress was calculated by measuring the degree of warping of a glass substrate before a silicon nitride layer was deposited, measuring the degree of warping of the glass substrate after the silicon nitride layer was deposited on the silicon substrate to a thickness of 100 nm, and calculating a difference in the radius of curvature by using, for example, the Stoney equation.

$$\sigma_{ii,r} = \sigma_{ii,int} + \sigma_{ii,th}$$
$$= \sigma_{ii,int} + \frac{-E_f}{1-v_f}(\alpha_{sub} - \alpha_{film})\Delta T$$
$$= -\left(\frac{1}{R} - \frac{1}{R_0}\right)\frac{E_{sub}}{1-v_{sub}} \cdot \frac{t_{sub}^2}{6t_{film}}$$

R: the radius of curvature of a glass substrate after deposition
R₀: the radius of curvature of the glass substrate before deposition
σ: a stress of a film
$E_f$: a Young's modulus of the film
$E_{sub}$: a Young's modulus of the glass substrate
$v_f$: a Poisson's ratio of the film
$v_{sub}$: a Poisson's ratio of the glass substrate
$t_{film}$: a thickness of the film
$t_{sub}$: a thickness of the glass substrate
$\alpha_{film}$: a thermal expansion coefficient of the film
$\alpha_{sub}$: a thermal expansion coefficient of the glass substrate
$\sigma_{ii,r}$: residual stress of film in biaxial direction
$\sigma_{ii,int}$: intrinsic stress of film in biaxial direction, which refers to the stress produced by a change of film density during or after deposition.
$\sigma_{ii,th}$: thermal stress of film in biaxial direction, which is due to differences in the thermal expansion coefficients of the film and substrate.

Referring to Table 2, the stresses of the silicon-rich silicon nitride layers of Examples 3 and 4 are less than the stresses of the silicon nitride layers of Comparative Examples 3 and 4.

TABLE 2

|  | Refractive index | Stress (Mpa) |
| --- | --- | --- |
| Example 3 | 1.82 | −200 |
| Example 4 | 1.83 | −120 |
| Comparative Example 3 | 1.80 | −450 |
| Comparative Example 4 | 1.79 | −550 |

As described above, according to the present invention, since a stress-free barrier layer is used, peeling-off and glass warping are prevented during a process of forming a backplane, thereby improving throughput. Also, a water vapor transmission rate may be reduced and impurities may be prevented from being diffused from a plastic substrate toward a TFT.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. An organic light-emitting device comprising:
a plastic film;
a first barrier layer on the plastic film and the first barrier layer comprises a first silicon oxide layer and a first silicon nitride layer;
a second barrier layer on the first barrier layer and the second barrier layer comprises a second silicon oxide layer and a second silicon nitride layer;
a thin film transistor (TFT) on the second barrier layer;
an organic emission layer on the second barrier layer and the organic emission layer is connected to the TFT, and
a further silicon oxide layer that is arranged between the first barrier layer and the second barrier layer,
the second silicon oxide layer being closer to the TFT than the second silicon nitride layer is,
the first silicon oxide layer being closer to the plastic film than the first silicon nitride layer,
a total thickness of silicon nitride layers included in the first barrier layer and the second barrier layer being less than a total thickness of silicon oxide layers included in the first barrier layer and the second barrier layer.

2. The organic light-emitting device of claim 1, wherein the second silicon oxide layer is thicker than the first silicon oxide layer.

3. The organic light-emitting device of claim 1, wherein the second silicon oxide layer is thicker than the further silicon oxide layer.

4. The organic light-emitting device of claim 1, wherein the second silicon oxide layer is thicker than the second silicon nitride layer.

5. The organic light-emitting device of claim 1, wherein the second silicon oxide layer is thicker than the first silicon nitride layer.

6. The organic light-emitting device of claim 1, wherein the first silicon oxide, the first silicon nitride layer, the further silicon oxide layer, the second nitride layer, and the second silicon oxide layer are arranged in the stated order from the plastic film toward the TFT.

7. The organic light-emitting device of claim 1, wherein the total thickness of the first barrier layer, the second barrier layer, and the further silicon oxide layer ranges from about 120 nm to about 2000 nm.

8. The organic light-emitting device of claim 1, wherein the first barrier layer, the second barrier layer, and the further silicon oxide layer are formed by at least one of chemical vapor deposition (CVD), plasma enhanced chemical vapor deposition (PECVD), and atomic layer deposition (ALD).

* * * * *